(12) United States Patent
Lam

(10) Patent No.: US 7,813,449 B2
(45) Date of Patent: Oct. 12, 2010

(54) REMOTELY CONTROLLED ANTENNA AND METHOD

(75) Inventor: Alan Man Lung Lam, Hong Kong (CN)

(73) Assignee: Radio Shack, Corporation, Fort Worth, TX (US)

( * ) Notice: Subject to any disclaimer, the term of this patent is extended or adjusted under 35 U.S.C. 154(b) by 1489 days.

(21) Appl. No.: 11/181,612

(22) Filed: Jul. 14, 2005

(65) Prior Publication Data

US 2007/0014383 A1 Jan. 18, 2007

(51) Int. Cl.
*H04L 27/00* (2006.01)

(52) U.S. Cl. .................. 375/316; 343/723; 343/757; 343/758; 343/766; 343/852

(58) Field of Classification Search ................ 455/136, 455/138, 151.1, 176.1, 188.2, 194.2; 375/316; 725/101, 107, 109, 123, 131; 343/723, 757, 343/758, 763, 766, 790, 852, 903, 882
See application file for complete search history.

(56) References Cited

U.S. PATENT DOCUMENTS

| | | | |
|---|---|---|---|
| 2,967,238 A * | 1/1961 | Frey | 334/53 |
| 3,701,036 A * | 10/1972 | Stefenel | 330/85 |
| 4,072,886 A | 2/1978 | Dammeter | |
| 4,334,230 A | 6/1982 | Kane | |
| 4,663,632 A | 5/1987 | Budroe et al. | |
| 5,812,066 A | 9/1998 | Terk et al. | |
| 6,016,108 A | 1/2000 | Terk et al. | |
| 6,034,643 A * | 3/2000 | Nishikawa et al. | 343/765 |
| 6,069,462 A | 5/2000 | Flynn | |
| 6,486,924 B1 | 11/2002 | Paraskevopoulos et al. | |
| 6,535,178 B1 | 3/2003 | Wang | |
| 6,697,610 B1 * | 2/2004 | Tait | 455/277.1 |
| 6,748,200 B1 * | 6/2004 | Webster et al. | 455/234.1 |
| 6,774,863 B2 * | 8/2004 | Shirosaka et al. | 343/797 |
| 2001/0018749 A1 * | 8/2001 | Noda et al. | 713/310 |
| 2002/0071498 A1 * | 6/2002 | Ishii | 375/316 |
| 2004/0053589 A1 | 3/2004 | Wang | |
| 2004/0102221 A1 * | 5/2004 | Shirosaka et al. | 455/562.1 |

* cited by examiner

*Primary Examiner*—David C Payne
*Assistant Examiner*—Rahel Guarino
(74) *Attorney, Agent, or Firm*—Dan Brown Law Office; Daniel R. Brown

(57) ABSTRACT

An antenna system for receiving radio waves and for operation in conjunction with a remote controller that transmits control data including gain state data. The antenna system includes an antenna that receives the radio waves and outputs a radio frequency signal and a radio frequency amplifier coupled to receive and amplify the radio frequency signal to a gain level controlled through a gain control input. A remote control receiver receives the control data and a controller is coupled to the gain control input and the remote control receiver. The controller couples the gain state data to the gain control input, thereby remotely controlling the gain level of the radio frequency amplifier. A remotely controlled antenna rotor is also taught.

28 Claims, 14 Drawing Sheets

TOP VIEW

REFLECTED BOTTOM VIEW

INSERTION LOSS WITHOUT MATCHING ELEMENT

INSERTION LOSS WITH MATCHING ELEMENT

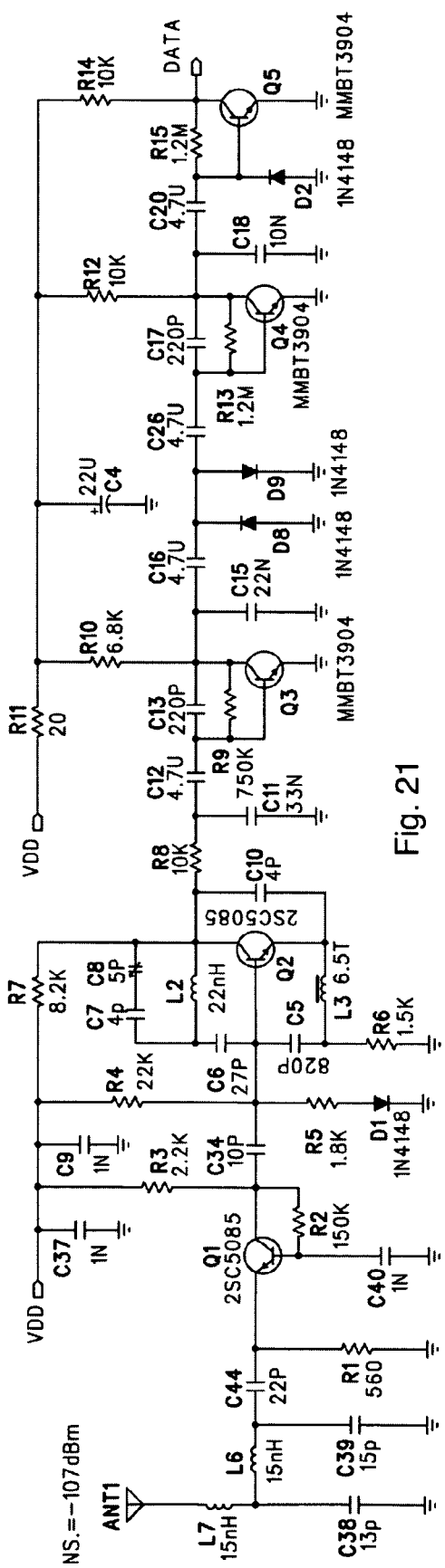
Fig. 21
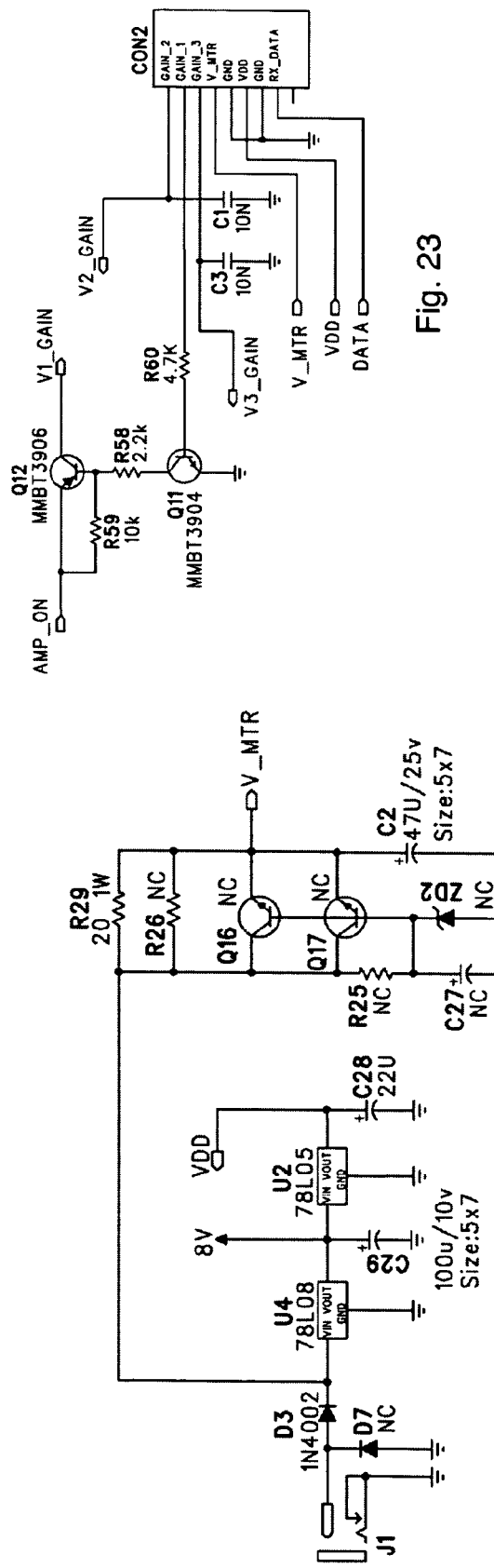
Fig. 23
Fig. 22

REMOTELY CONTROLLED ANTENNA AND METHOD

BACKGROUND OF THE INVENTION

1. Field of the Invention

The present invention relates to antennas. More specifically, the present invention relates to remotely controlled television antennas with channel memory and having a programmable gain amplifier and a remotely controlled antenna rotor.

2. Description of the Related Art

Television viewing is ubiquitous in modern society. Users access television program content though radio broadcast signals, cable, satellite, and prerecorded media. While cable, satellite and prerecorded media offer excellent performance in terms of video and audio quality, they all require some payment of ongoing services fees or a purchase price. Broadcast television is unique in that it is typically accessible without recurring charges. However, broadcast television service is disadvantaged by the vagaries of radio wave propagation. It is a common collective experience of users to deal with antenna and tuning issues in seeking clear and stable television reception.

Broadcast television reception antennas are available in a wide variety of configurations. Each antenna design includes compromises between size, cost, radio performance, ease of installation, and operating convenience. For example, at the low end of the range is the single element rod antenna extending from the back of the television set. The rod antenna is small, low cost, easy to install and fairly convenient to operate. However, the radio performance of the rod antenna is poor having a gain that may be unity or less. Users of rod antennas frequently struggle to get decent picture and sound quality, especially at lower frequency channels where a large physical structure is needed for the antenna to be resonant and couple radio energy efficiently. Rod antennas are only effective in very strong signal strength environments, at close ranges to television broadcast transmitters. At the high end of the range are large multi-element log periodic antennas that may include dozens of elements sized to be resonant and cover the entire television broadcast frequency range, and even cover certain radio broadcast frequency ranges, such as commercial FM broadcasts. These antennas can be very large, requiring outdoor mounts, rooftop mounts, and long feed lines. They are expensive and difficult to install. Installation includes aiming the main beam of the antenna towards television broadcast station. The benefit of these antennas is excellent radio performance, offering fully quieted receiver performance at long distances from the broadcast stations, sometimes exceeding 75 or 100 miles.

Designers of television antenna systems have devised numerous devices and techniques of improving performance of television antennas, particularly with regards to mitigating the unfavorable nature of the aforementioned compromises. Motorized antenna rotors have been added to direct the main beam of an antenna toward particular broadcast stations, thereby enabling users to "steer" the antenna system on a channel-by-channel basis. Radio frequency ("RF") amplifiers have been added to boost signal strength of otherwise underperforming passive antenna designs. Tuned matching elements have been added to more efficiently couple energy between an antenna and the feed line that connects it to a television receiver. Compact antennas for interior installation have been offered to overcome the problems of outdoors and rooftop installations. Remote controls for antenna direction selection are known as well. Some remotes have been integrated with television receiver channel selection remotes to simplify operation. Still, there exist problems with all of the prior art designs. For example, adding an RF amplifier can be beneficial in weak signal conditions, yet may saturate the television receiver on channels with strong signals, thereby reducing performance. Compact antennas for indoor use suffer from poor performance at lower frequencies. Complex gain and matching element designs added to improve performance of compact antennas are confusing for users to operate, limiting the real potential benefit of such designs.

The advent of high definition television ("HDTV") has exacerbated the issues with regards to antenna design compromises. Users of HDTV are seeking dramatic improvements in video performance and picture clarity. HDTV viewing can be considered "critical" television viewing. Thus, any weakness in broadcast antenna performance is most noticeable and objectionable. Still, the aforementioned design compromises with respect to the vagaries of radio wave propagation continue to exist. Thus it can be understood that there is a need in the art for a apparatus and method for receiving broadcast television and radio signals that provides exceptional RF performance across multiple channels and frequencies, is physically compact, is easy to install, is convenient to operates, and is available at reasonable cost to users.

SUMMARY OF THE INVENTION

The need in the art is addressed by the apparatus and methods of the present invention. An antenna system for receiving radio waves and for operation in conjunction with a remote controller that transmits control data including gain state data is taught. The antenna system includes an antenna that receives the radio waves and outputs a radio frequency signal and a radio frequency amplifier coupled to receive and amplify the radio frequency signal to a gain level controlled through a gain control input. A remote control receiver receives the control data and a controller is coupled to the gain control input and the remote control receiver. The controller couples the gain state data to the gain control input, thereby remotely controlling the gain level of the radio frequency amplifier.

In a specific embodiment of the antenna system, the remote controller transmits the control data by encoded radio signals, and remote control receiver is an encoded radio signal receiver. In another specific embodiment, the gain control input has plural gain control input lines that are electrically coupled to plural gain control diodes. The controller selectively biases the plural gain control diodes in accordance with the gain state data, thereby selectively setting the radio frequency amplifier among plural discrete gain states. In a refinement, the plural discrete gain states include ten decibels, fifteen decibels, and nineteen decibels of gain.

In another specific embodiment of the antenna system, the antenna is a three-element log periodic array configured for reception of a band of frequencies from 470 megahertz to 890 megahertz. In a particular refinement, the three-element log periodic array is disposed upon a printed circuit board substrate and designed for reception of an operating band of frequencies from 550 megahertz to 890 megahertz, thereby reducing the physical dimensions of the three-element log periodic array. It is also designed for an insertion return loss of less than minus ten decibels within the operating band of frequencies. The antenna also includes a matching element disposed upon the printed circuit board substrate that is coupled to the three-element log periodic array, and tuned to match an extended band of frequencies from 470 MHz to 550

MHz with an insertion return loss of less that minus ten decibels within the extended band of frequencies.

In another specific embodiment of the antenna system, the control data further includes antenna position data, and the antenna system includes a housing rotatably supporting the antenna and a motor coupled to rotate the antenna with respect to the housing. The controller drives the motor to selectively rotate the antenna to plural positions in accordance with the antenna position data. In a refinement, the antenna system further includes a flexible feed line for connecting the radio frequency signal between the antenna and the radio frequency amplifier, and a rotational stop fixed to the housing and engaged to limit the rotation of the antenna to an angle of rotation of approximately three hundred and sixty degrees, thereby limiting the twist of the feed line to within the angle of rotation.

In another specific embodiment of the antenna system, the antenna position data defines twelve discrete angular positions and the motor is a digital proportional motor. The controller drives the motor to selectively rotate the antenna to the twelve discrete positions in accordance with the antenna position data. In another specific embodiment, a raydome is fixed to the housing and the antenna is disposed to rotate within the raydome.

In another specific embodiment of the antenna system, the control data further includes location data, the system includes a memory accessed by memory addresses and coupled to the controller for storing control data. The controller stores a portion of the control data at a memory address associate with the location data. In a refinement, the location data is correlated to channel numbers that correspond to television reception channels.

In another specific embodiment of the antenna system, the control data further includes a store command and the controller identifies the most recently received control data as present control data. The controller further stores the present control data in accordance with the corresponding present location data upon receipt of the store command from the remote control receiver. In a further refinement, the controller recalls a portion of the control data from a memory address, and assign it as present control data, upon receipt of a new control data that includes location data but does not include gain state data or antenna position data.

In another specific embodiment, the antenna system further includes a display coupled to the controller to display a portion of the present control data on the display. In a further refinement, the antenna system also includes an actuator fixed to the housing for entering control data without use of the remote controller.

The present invention also teaches an antenna system for receiving radio waves and for operation in conjunction with a remote controller that transmits encoded radio signals with control data that may include gain state data, antenna position data, location data, and a store command. The antenna systems includes an antenna designed to receive the radio waves in a band of frequencies from 470 megahertz to 890 megahertz and that outputs a radio frequency signal. The antenna includes a three-element log periodic array disposed upon a printed circuit board substrate that is resonant in an operating band of frequencies from 550 megahertz to 890 megahertz, thereby reducing the physical dimensions of the three-element log periodic array with respect to the band of frequencies. It is also designed for an insertion return loss of less than minus ten decibels within the operating band of frequencies. The antenna further including a matching element disposed upon the printed circuit board substrate that is coupled to the three-element log periodic array, and that is tuned to match an extended band of frequencies from 470 MHz to 550 MHz with an insertion return loss of less that minus ten decibels within the extended band of frequencies.

A radio frequency amplifier receives and amplifies the radio frequency signal to a gain level controlled through a gain control input that has plural gain control input lines electrically coupled to plural gain control diodes. The antenna system also includes an encoded radio signal remote control receiver that receives the control data. A controller is connected to the plural gain control input lines and the remote control receiver, and selectively biases the plural gain control diodes in accordance with the gain state data, thereby selectively setting the radio frequency amplifier to either ten decibels, fifteen decibels, and nineteen decibels of gain, and thereby remotely controlling the gain level of the radio frequency amplifier.

The antenna system is built into a housing having a raydome rotatably supporting the antenna, which is disposed to rotate within the raydome. A digital proportional motor rotates the antenna with respect to the housing and the controller drives the motor to selectively rotate the antenna to twelve discrete positions in accordance with the antenna position data received in the control data. A flexible feed line connects the radio frequency signal between the antenna and the radio frequency amplifier. A rotational stop fixed to the housing is provided to limit the rotation of the antenna to an angle of rotation of approximately three hundred and sixty degrees, thereby limiting the twist of the feed line to within the angle of rotation.

The antenna system also includes a memory accessed by memory addresses that is coupled to the controller for storing control data. The controller stores a portion of the control data at a memory address associate with the location data that is correlated to channel numbers that correspond to television reception channels. The controller identifies the most recently received control data as present control data and stores the present control data in accordance with the corresponding present location data upon receipt of the store command from the remote control receiver. The controller can also recall a portion of the control data from a memory address, and assign it as present control data, upon receipt of new control data that includes location data but does not include gain state data or antenna position data. A display is connected to the controller, and displays a portion of the present control data on the display. An actuator is provided for entering control data without use of the remote controller.

The present invention also teaches a method of receiving radio waves by utilizing an antenna that outputs a radio frequency signal to a gain controlled radio frequency amplifier, which operate in conjunction with a remote controller. The method includes the steps of receiving control data including gain state data from the remote controller, and amplifying the radio frequency signal to a gain level corresponding to the gain state data.

In a specific embodiment of the method, the remote controller transmits the control data by encoded radio signals, and the receiving step is accomplished with an encoded radio signal receiver. Another embodiment adds the step of selectively biasing plural gain control diodes in accordance with the gain control data, thereby selectively setting the radio frequency amplifier among plural discrete gain states.

In another specific embodiment of the method wherein the control data further includes antenna position data, the further step of selectively rotating the antenna using a motor and in accordance with the antenna position data is added. In another refinement, wherein the antenna position data defines twelve discrete angular positions, the selectively rotating step includes stopping at one of twelve discrete positions in accordance with the antenna position data.

In another specific embodiment of the method, wherein the control data further includes location data, the method includes the further step of storing a portion of the control data in a memory at a memory address associated with the location data. In a refinement, the location data is correlated to channel numbers that correspond to television reception channels.

In another specific embodiment of the method, wherein the control data further includes a store command, the method includes the additional steps of identifying the most recently received control data as present control data, and storing the present control data in accordance with the corresponding present location data upon receiving a store command from the remote controller. In a refinement, the method includes the further steps of recalling a portion of the control data from a memory address, and assigning it as present control data upon receiving of a new control data that includes location data but does not include gain state data or antenna position data. In yet another refinement, the method includes the further step of displaying a portion of the present control data on a display.

BRIEF DESCRIPTION OF THE DRAWINGS

FIG. 21 is a schematic diagram of a RF remote control receiver according to an illustrative embodiment of the present invention.

FIG. 22 is a schematic diagram of an antenna power supply according to an illustrative embodiment of the present invention.

FIG. 23 is a schematic diagram of an RF amplifier gain control circuit according to an illustrative embodiment of the present invention.

DESCRIPTION OF THE INVENTION

Figure 4:
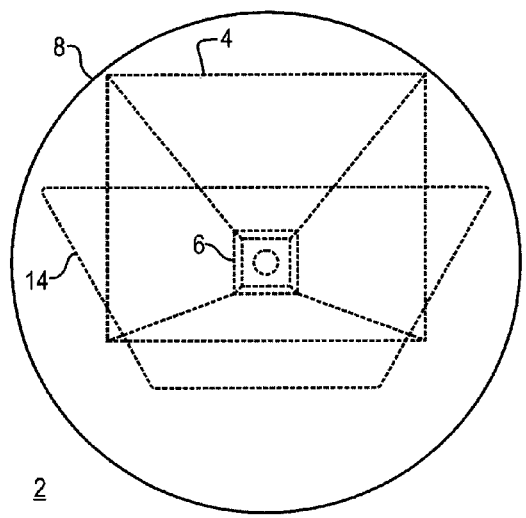
FIG. 4 is a top view of an antenna system according to an illustrative embodiment of the present invention.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope hereof and additional fields in which the present invention would be of significant utility.

An illustrative embodiment of the present invention is a shelf mounted indoor TV antenna designed to receive broadcast high-definition television ("HDTV"). A log periodic antenna structure is tuned and impedance matched to receive the UHF TV band, which are principally TV channels 14 through 69. The antenna structure rotates within a stationary and compact ray dome that sits atop an antenna base. A digital-proportional motor rotates the antenna to twelve discrete positions, each spaced 30° from the next. An RF amplifier provides three programmable gain settings of +10 dB, +15 dB and +19 dB. A memory within the antenna base stores 100 channels of data, each including an antenna direction and a gain setting. The antenna includes a display, including channel number, direction setting, and gain setting, and an RF wireless remote receiver. The user programs and accesses the channel programming and selection with a handheld wireless remote controller. Partial redundant controls are provided on the antenna base.

The illustrative embodiment is a microprocessor controlled antenna that allows the user to rotate the antenna in 12 distinct positions either clockwise or counterclockwise for best UHF reception. One hundred channel memories allow the user to set-up 100 distinct channels, numbered "00" through "99", each of which has a particular antenna direction and gain setting stored for later recall. In addition manual controls allow the user to adjust the antenna when the RF remote controller is not available, or when custom adjustments are desired. In addition, the illustrative embodiment includes an "A/B" RF switch for selecting between the antenna or an external signal, such as cable, satellite, or a video game system. An LED indicator is provided to confirm command and control receipt by the antenna system. An LCD display is provided on the antenna base to indicate current status, including channel number, antenna direction and gain setting.

The illustrative embodiment antenna system is typically placed near the user's TV set, or FM radio receiver, and connected via a 75 ohm coaxial cable. Power is provided using a wall-plug transformer power supply, as are well known by those skilled in the art. A radio remote controller is used to conveniently access and control the antenna system, and, the remote controller is powered by a compact battery.

Figure 1:
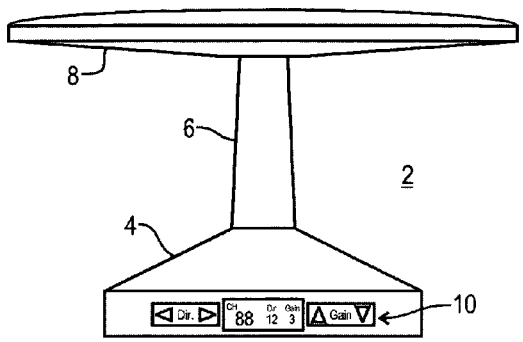
FIG. 1 is a front view of an antenna system according to an illustrative embodiment of the present invention.
Figure 2:
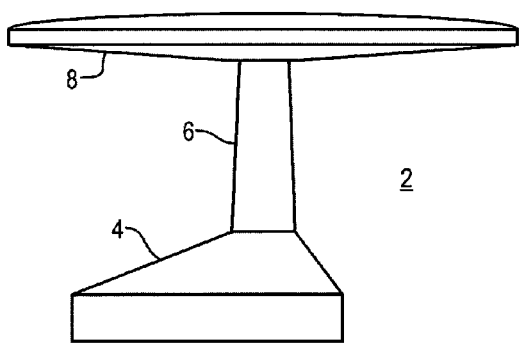
FIG. 2 is a side view of an antenna system according to an illustrative embodiment of the present invention.
Figure 3:
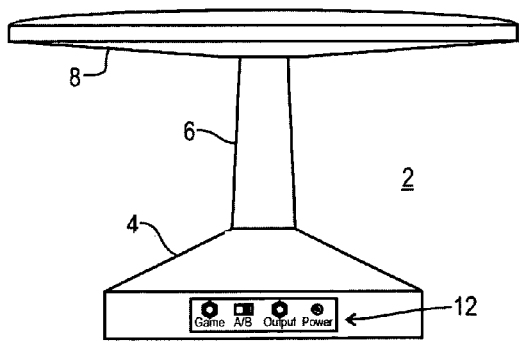
FIG. 3 is a back view of an antenna system according to an illustrative embodiment of the present invention.

Reference is directed to FIG. 1, which is a front view of an antenna system 2 according to an illustrative embodiment of the present invention. FIG. 1 is a general overview of the illustrative embodiment showing the fixed raydome 8 on top of an extension 6 of the housing base 4. A user interface 10 is presented on the front of the housing 4. FIG. 2 is a side view of the antenna system 2 according to the illustrative embodiment of the present invention. The raydome 8 is fixed to the base 4 of the housing by housing extension 6. The housing extension 6 serves to raise the raydome 8 above the surface (not shown) on which the base 4 rests. In a typical application, the antenna system 2 sits on top of the television set it is coupled to, or on any other nearby horizontal surface such as a shelf. FIG. 3 is a back view of the antenna system 2 according to the illustrative embodiment of the present invention. Again, the raydome 8, base 4, and extension 6 are shown. The interface panel 12 is on the back of the housing 4, and serves to connected power and signal conductors to the antenna system 2.

Figure 5:
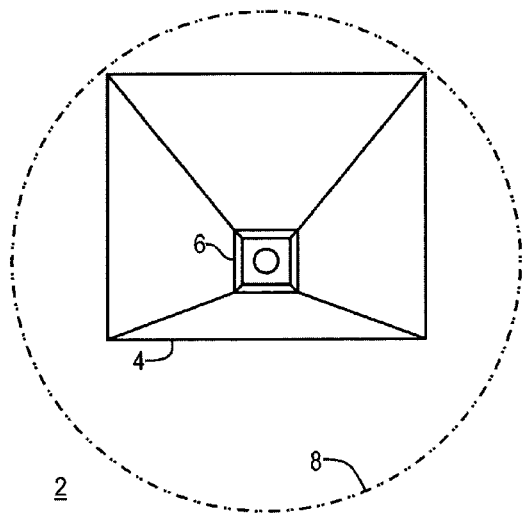
FIG. 5 is a top view of the base of an antenna system according to an illustrative embodiment of the present invention.

Reference is directed to FIG. 4, which is a top view of the antenna system 2 according to the illustrative embodiment of the present invention. The raydome 8 is shown, with the base 4 and base extension 6 portion of the housing shown with broken lines below. Note that the antenna 14 is also shown within the raydome 8, and the antenna will be more completely described hereinafter. FIG. 5 is a top view of the base 4 and base extension 6 portions of the antenna housing of the antenna system 2 according to an illustrative embodiment of the present invention. The raydome 8 is shown with phantom lines.

Figure 6:
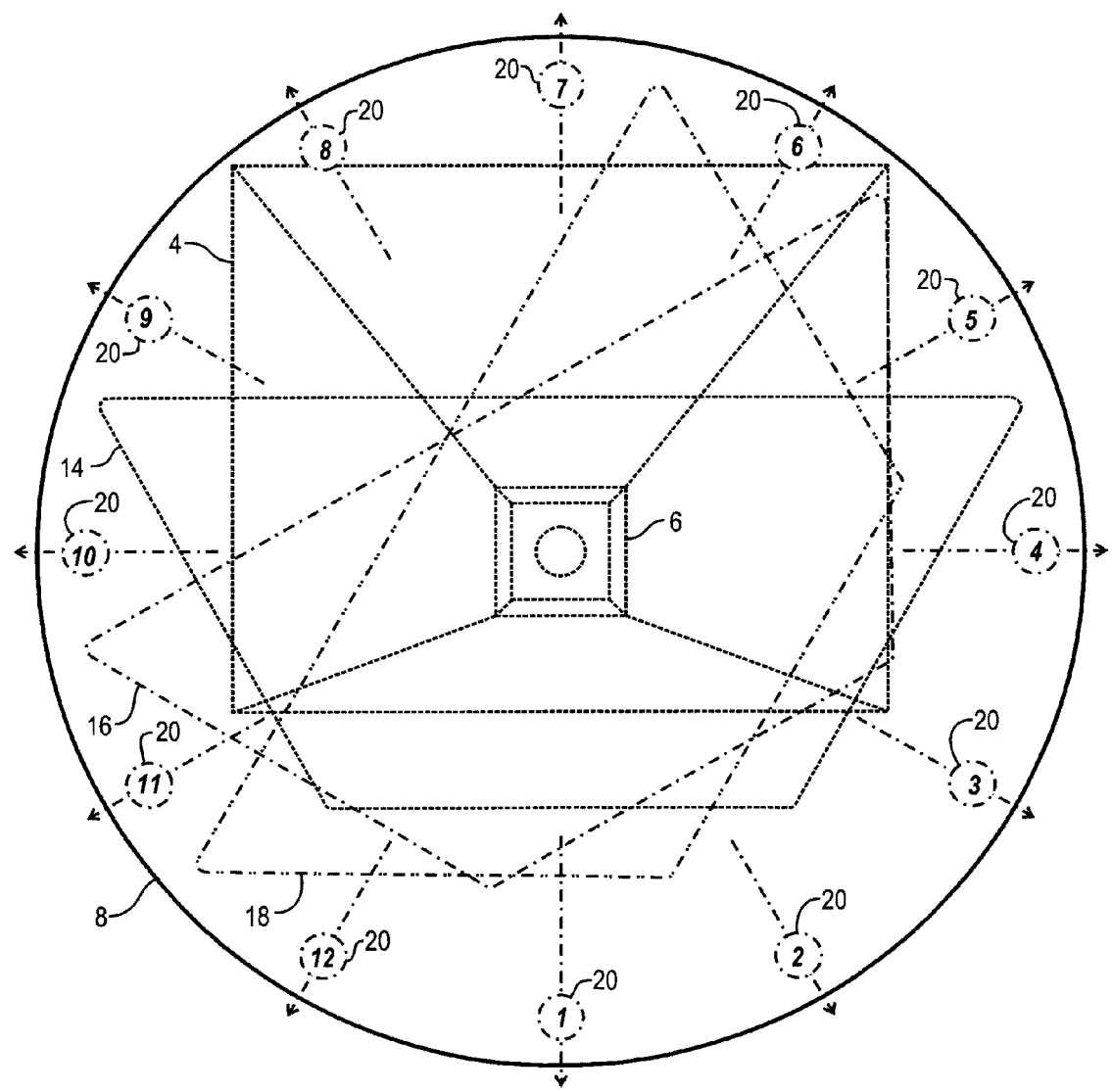
FIG. 6 is an antenna rotor direction diagram according to an illustrative embodiment of the present invention.

Reference is directed to FIG. 6, which is an antenna rotor direction diagram according to an illustrative embodiment of the present invention. FIG. 6 illustrates the rotation of the antenna 14 within raydome 8, which is fixed to the base extension 6 on top of the base 4 portion of the housing. The antenna 14 is shown with broken lines, as it is located within the raydome 8. A motor (not shown) is driven to move the antenna to twelve discrete angular positions, indicated by reference numeral 20, and the twelve italicized numbers in phantom line arrows with circles in FIG. 6. Each of the twelve positions 20 are spaced thirty degrees from one another. The beam width of the antenna 14 is wide enough so that full three-hundred-sixty degree radio reception coverage is achieved. The phantom arrow 20 shows the main antenna beam direction for each of the twelve angular positions. The antenna 14 is oriented toward direction arrow "1" in the Figure. The first phantom antenna position 16 is oriented toward direction arrow "2", and the second phantom antenna position 18 is oriented toward direction arrow "3", etc. Thus it can be understood that the antenna 14 rotates within the fixed raydome 8. This arrangement is advantageous because it protects the antenna and prevents interference with its rotation during normal operation. The raydome is not essential to the radio signal reception function of the illustrative embodiment antenna system.

The antenna system of the illustrative embodiment is intended for use with HDTV broadcast reception, which includes channels located in the 470 MHz to 890 MHz band. Since it is an indoor, shelf-mounted, antenna system design, compact physical dimension are required. The performance criteria required an antenna with passive gain coupled to an adjustable gain RF amplifier, which provides an additional active gain of 10 dB, 15 dB, or 19 dB. Those skilled in the art will appreciate that a broadband antenna with a passive gain across the band of interest will require an array of antenna elements. Those skilled in the art will also be familiar with the log periodic antenna array and the means and techniques to design and implement such an antenna in the 470 MHz to 890 MHz band of interest. Generally, the longest element in a log periodic array antenna is a half-wave dipole resonant at the lowest frequency in the band of interest. In the case of 470 MHz, that length is approximately one-third of a meter, and the passive gain requirement will dictate a four-element array. Since this antenna array rotates in a raydome that must enclose the swept area of the rotating array, the one-third meter size and four-element design are excessively large. The design technique of the illustrative embodiment reduced the size be selecting a higher frequency of 550 MHz as the low range design limit for the log periodic array design procedure. This change yielded an antenna with a 275 mm low frequency element length and an array of just three elements total. The reduced size array performed every well in the 550 MHz to 890 MHz range, but that had poorer performance in terms of antenna insertion return loss in the 470 MHz to 550 MHz band. To overcome this problem, a pair of matching elements was added to the array. The design details of the illustrative embodiment antenna appear in FIG. 7, FIG. 8, and FIG. 9.

Figure 7:
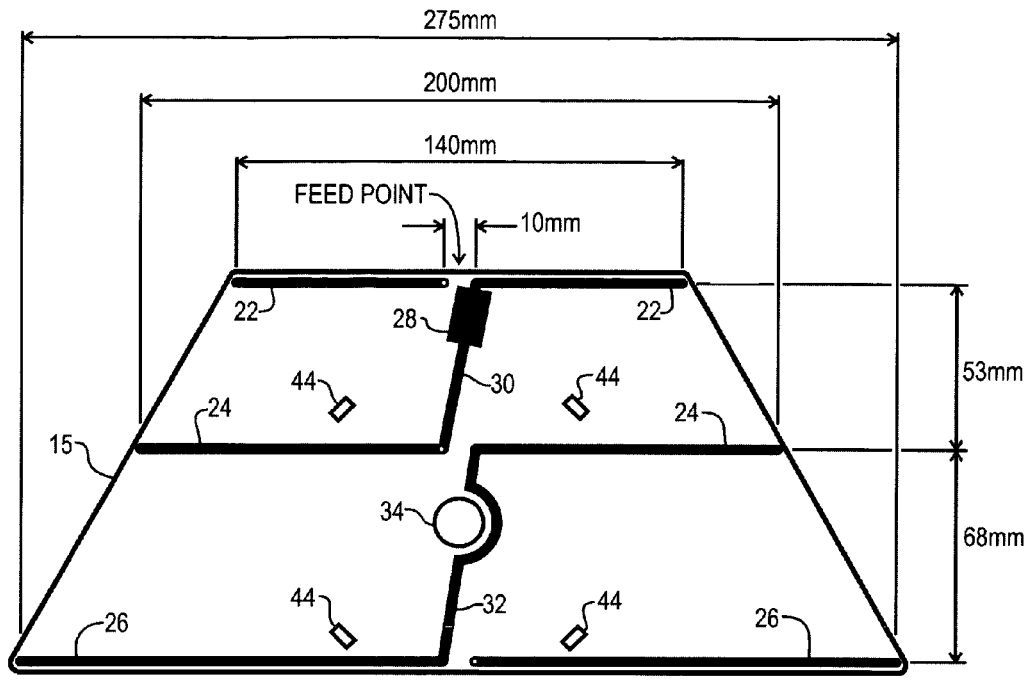
FIG. 7 is a drawing of a log periodic antenna according to an illustrative embodiment of the present invention.

Reference is directed to FIG. 7, which is a drawing of the reduced size log periodic antenna 14 according to the illustrative embodiment of the present invention. The antenna 14 is fabricated on a printed circuit board substrate 15 that is sized to enable the three elements of the array, 22, 24, and 26, to be etched thereupon. To achieve the stated resonant band of 550 MHz to 890 MHz, the array comprises three elements, with the longest 26 at the rear having an overall length of 275 mm. The middle element 24 is placed 68 mm in front of the rear element 26, and has an overall length of 200 mm. The shortest element 22 is placed 53 mm in front of the middle element 24, and has an overall length of 140 mm. Each of the dipole elements has a 10 m gap at the center, and the feed point to the array is the gap at the center of the shortest, front, element 22. The interconnection of the elements is a standard crossed-connection technique as is known to those skilled in the art. FIG. 7 illustrates the etched top surface of the antenna array. An inductive matching element 28 is disposed along the interconnecting line 30 between the front element 22 and the middle element 24. The interconnecting line 32 between the middle element 24 and the rear element 26 is routed about an opening 34 formed to clear a mounting shaft (not shown). In addition, FIG. 7 illustrates four mounting tab holes 44 that engage a mounting platform (not shown).

Figure 8:
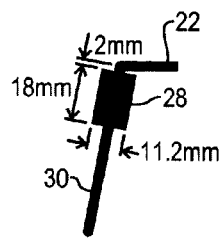
FIG. 8 is a drawing of an antenna matching element according to an illustrative embodiment of the present invention.

Reference is directed to FIG. 8, which is a drawing of the antenna matching element 28 according to the illustrative embodiment of the present invention. The matching element 28 is centered along the interconnecting line 30 and is placed 2 mm behind the front element 22. The matching element is etched in the printed circuit fabrication process and is 11.2 mm wide and 18 mm long. A corresponding matching element 36 is also placed on the bottom of the antenna 14, and has the same physical dimensions.

Figure 9:
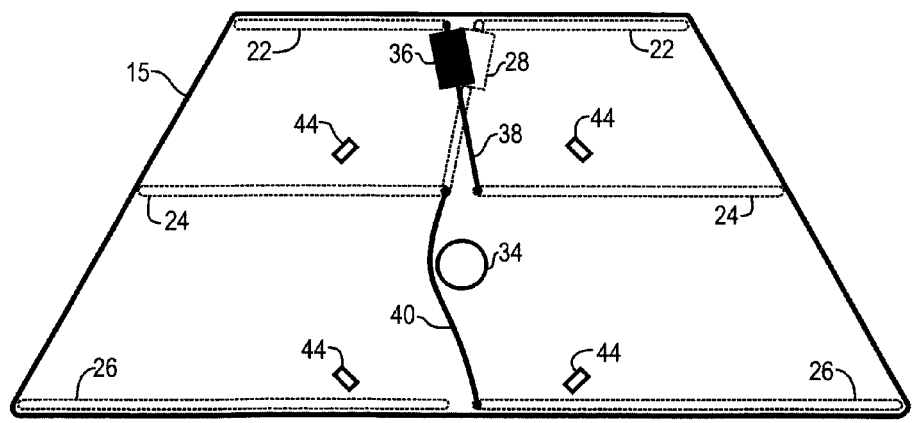
FIG. 9 is a drawing of a log periodic antenna according to an illustrative embodiment of the present invention.

Reference is directed to FIG. 9, which is a drawing of the bottom of the log periodic antenna 14 according to the illustrative embodiment of the present invention. FIG. 9 is a reflected view so that is graphically corresponds to FIG. 7. The printed circuit board substrate 15 is illustrated together with the three elements 22, 24, and 26, which are appropriately shown with hidden lines as they are etched upon the top surface. Cross-connected wire lines 38 and 40 complete the array interconnection. A second matching element 36 is disposed upon the bottom of the board 15, and is electrically coupled to interconnecting line 38. The position and dimensions of the matching element 36 mirror that of matching element 28. The clearance hole 34 and mounting tab holes 44 are also illustrated.

Figure 10:
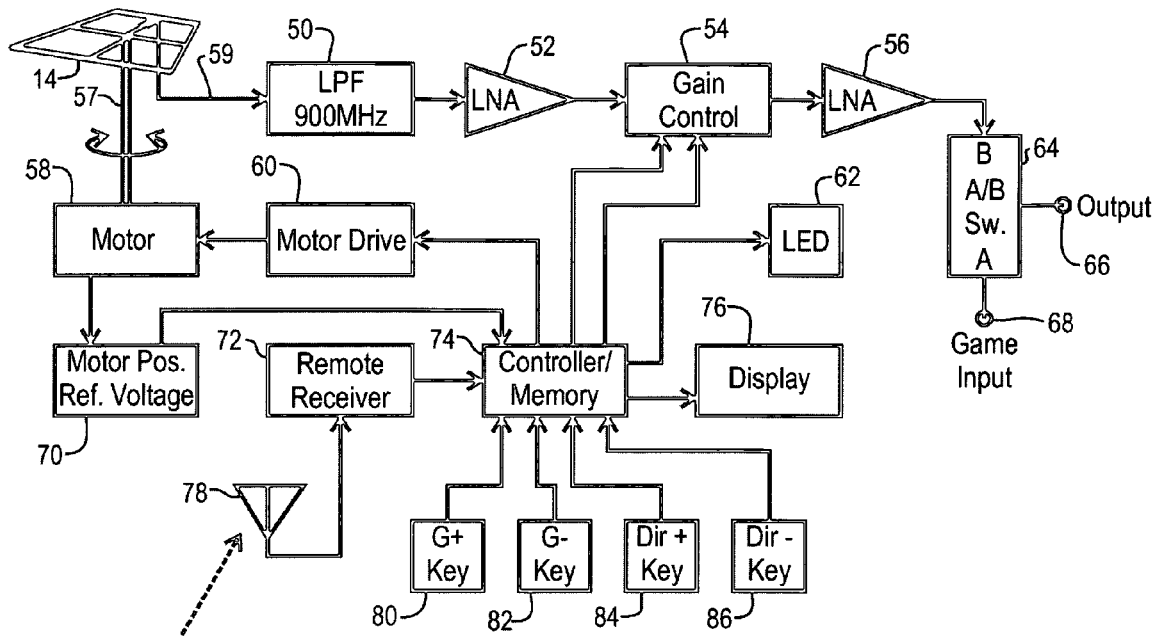
FIG. 10 is a functional block diagram of an antenna system according to an illustrative embodiment of the present invention.

FIG. 10 is a functional block diagram of the antenna system according to the illustrative embodiment of the present invention. The antenna array 14 is coupled to a 900 MHz low-pass filter by a coaxial feed line 59. A first stage low noise amplifier 52 boosts the gain of the signal by 10 dB. A gain control circuit 54 selectively controls the gain of a second stage low noise amplifier 56, and the gain increments are 10 dB, 15 dB and 19 dB. The output of the second stage low noise amplifier 56 is coupled to the "B" input of a radio frequency "A/B" switch 64. The output 66 of the A/B switch is presented for user interconnection of the antenna system to a television receiver. The "A" input 68 of the A/B switch 64 is presented for user connection of another video source, such as a video game, etc.

The antenna array 14 in FIG. 10 is rotatably supported by a rotor shaft 57, which is driven by a digital proportional motor 58. The motor 58 selectively drives the antenna 14 to one of twelve discrete angular directions. The drive circuitry of the motor 58 includes a digital drive interface 60 with controller 60, and also includes a motor position reference voltage generator 70. The reference voltage enables determination of the specific motor angular position through a feedback path to the controller. Digital proportional motor drive circuits are understood by those skilled in the art. The controller 74 of the illustrative embodiment is a four-bit microcontroller with four kilobytes of on-board memory, and is of the type known to those skilled in the art to be suitable for dedicated control applications. The controller 74 is coupled to various user interface components.

The user interface coupled to controller 74 includes a light emitting diode 62 that is illuminated to indicate status and state of operation where the apparatus is awaiting user input of control information. A liquid crystal display 76 is coupled to the controller 74, which presents channel number display, indicating memory storage location of the gain and direction settings. In addition, the display 76 also shows the current antenna direction, indicated by numerals one through twelve, and the current gain setting, indicated by numerals one through three. Four contact closure key actuators are provided, and include gain increase key 80, gain decrease key 82, direction increase key 84 and direction decrease key 86. Direction may also be indicated as clockwise and counter-clockwise directions. A 433.92 MHz remote control receiver 72 and corresponding remote controller antenna 78 are also provided. The receiver 72 is a regenerative receiver that demodulates digitally encoded command and control data, which is then coupled to the controller. The digitally encoded remote controller is illustrated in FIG. 11.

Figure 11:
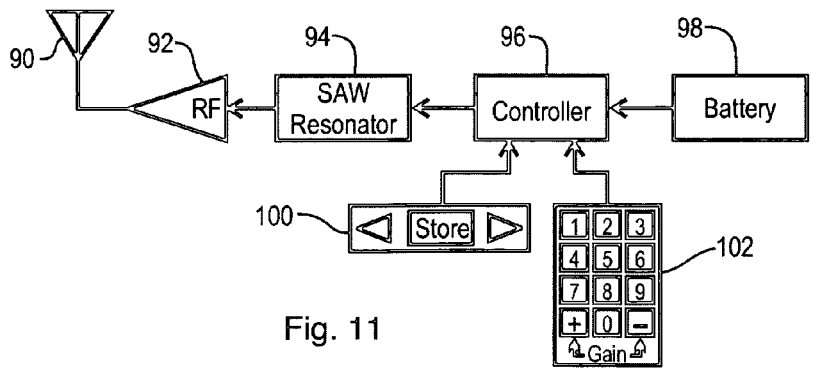
FIG. 11 is a functional block diagram of an antenna system remote controller according to an illustrative embodiment of the present invention.
Figure 12:
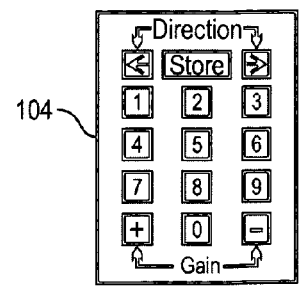
FIG. 12 is a drawing of an antenna remote controller according to an illustrative embodiment of the present invention.

Reference is directed to FIG. 11, which is a functional block diagram of an antenna radio remote controller according to the illustrative embodiment of the present invention. The remote controller utilizes a digital controller 96, which is of a type known to those skilled in the art to be suitable for use in low-power hand-held remote controller applications. A battery 98, such as a compact lithium battery, is used to power the remote controller. A numeric keypad with gain selection controls 102 is coupled to the controller 96. A direction keypad with "STORE" actuator 100 is also coupled to the controller 96. The controller interprets key actuations by the user and transmits command and control information using a 433.92 MHz surface acoustic wave resonator 94, a radio frequency amplifier, and an antenna 90 to communicate with the antenna system. FIG. 12 illustrates the keypad 104 arrangements in the illustrative embodiment remote controller.

As noted hereinbefore, the antenna has twelve distinct directions about its axis of rotation and three gain levels selectable by the user. There are one hundred storage locations in the system's memory, which are called channel memories and are associated with television channels. There are numbered from "00" to "99" and each stores both an antenna direction and a gain setting. In operation, the user can choose to manually change the antenna direction by pressing "<" or ">" key actuators, and the gain level can be manually selected by pressing the "+" or "−" keys on the front panel of the antenna system housing or on the remote controller. The user can also store the present antenna direction and the gain level to one of the channel memory locations for later recollection.

In one illustrative embodiment of the present invention, the procedure for storing a new antenna system channel memory is as follows. The user presses and holds the "STORE" actuator until the "DIRECTION", "GAIN" and "CH" indicators on the display begin to flash. The user then selects an antenna direction as the present antenna direction by pressing the "<" or ">" to change the direction of the antenna to obtain a strong signal. Then, the user presses the "+" or "−" to select one of the three gain levels. Next, the user selects a channel to store the presently selected antenna direction and gain level by pressing a number between "00" and "99" on the remote controller. Finally, the user presses "STORE" to save the antenna direction, the gain level and the channel number. The indicators stop flashing to indicate the end of preset mode. On the other hand, if no key is pressed within thirty seconds after the indicators start flashing, the preset mode is exited automatically. There are three available gain levels that the user can select either manually or using the remote controller. These includes gain level "3" for use with weak or distant stations, gain level "2" for use with most stations, and gain level "1" for use with strong or nearby stations, or when the antenna is not being used.

Figure 13:
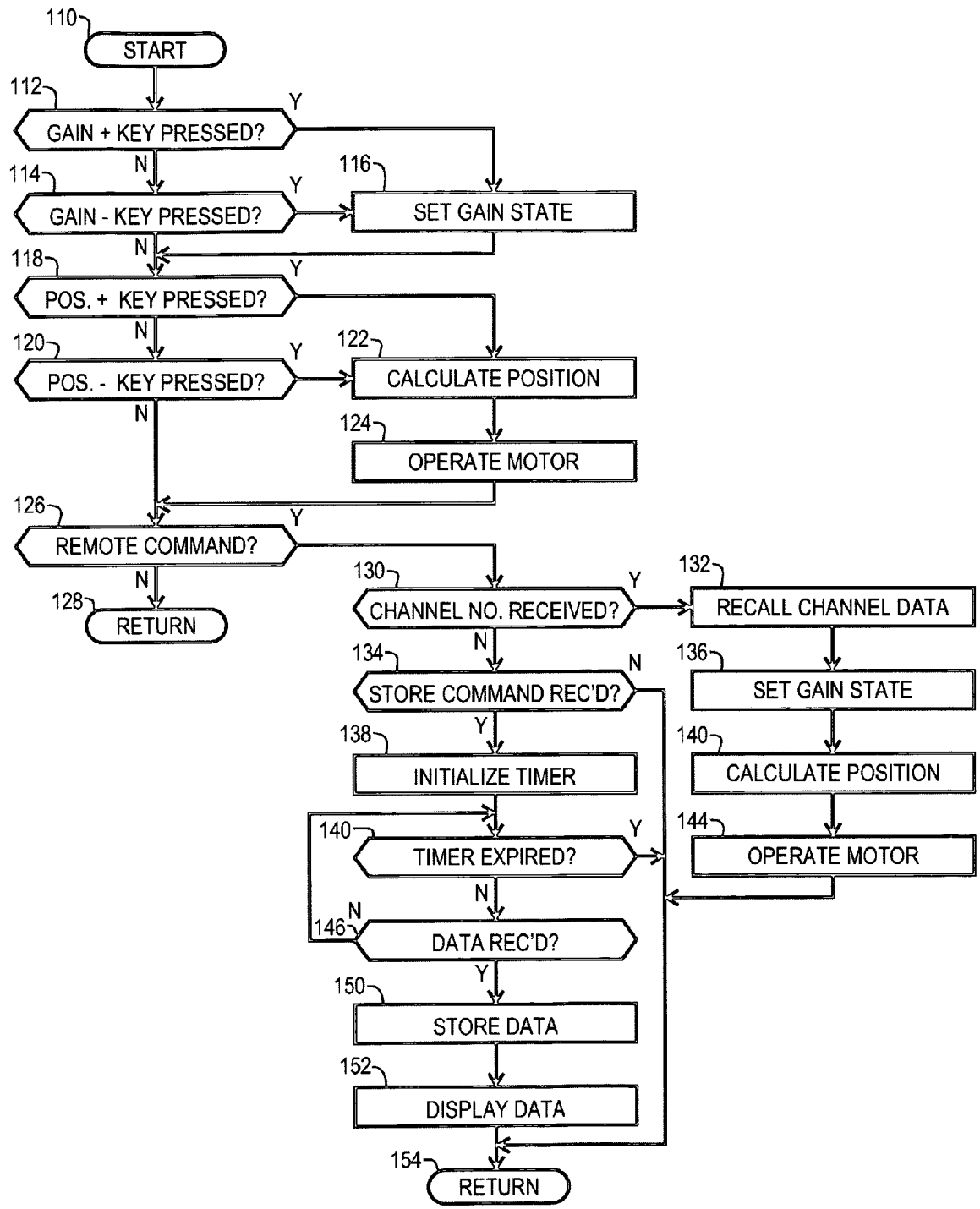
FIG. 13 is a process flow diagram according to an illustrative embodiment of the present invention.

Reference is directed to FIG. 13, which is a process flow diagram according to another illustrative embodiment of the present invention. FIG. 13 illustrates a process operating within the antenna system of the illustrative embodiment. The process begins at step 110 and proceeds to steps 112 and 114 where a test of the "Gain +" key and "Gain −" key actuations are made, respectively. If either key has been pressed the selected gain state is set at step 116. Upon completion, or if neither key has been pressed, flow proceeds to step 118. Steps 118 and 120 are tests to determine if the "Pos. +" or "Pos. −" keys have been pressed, respectively. If either has been pressed, then flow proceeds to step 122 where the required motor position is calculated and the controller operates the motor to move to the desired position at step 124. Upon completion of the motor movement, or if no key is pressed at steps 118 or 120, then flow proceeds to step 126. Step 126 is a test to determine if a signal command has been received from the remote controller. If no signal is received, then flow returns at step 128 to recycle through the aforementioned testing sequence. On the other hand, if a remote command has been received, then flow proceeds to step 130.

Step 130 in FIG. 13 is the entry point for a remote controller command handling routine. Step 130 is a test to determine if a channel number has been received from the remote. If a channel number has been received, then flow proceeds to step 132 where the direction and gain setting for the received channel are recalled. Then, at step 136, the recalled gain state is set and at steps 140 and 144, the antenna position data are calculated and the motor operated to set the antenna to the recalled angular position. After setting the gain and direction, flow returns at step 154. On the other hand, at step 30, in no channel number has been received, then flow proceeds to step 134. Step 134 is a test to determine is a "STORE" command has been received from the remote. If not, flow returns via step 154. If a "STORE" command has been received, then flow proceeds to step 138 where a timer is initialized. The timer is set for thirty seconds, which gives the user an allotted time to complete the direction and gain input process. Step 140 is a test to determine if the timer has expired. If it has, then flow returns via step 154. On the other hand, if the timer has not expired, then flow proceeds to step 146 to test if direction and gain data have been received from the remote. If the data transfer is not yet complete, then flow returns to step 140 as the timer runs, waiting for user inputs. If, at step 146, the gain and direction data have been received, then flow proceeds to step 150 where the data is stored in the memory at the channel location received at step 130. At step 152, the present direction and gain setting are displayed to confirm entry of the user's inputs. Flow then returns via step 154.

Figure 14:
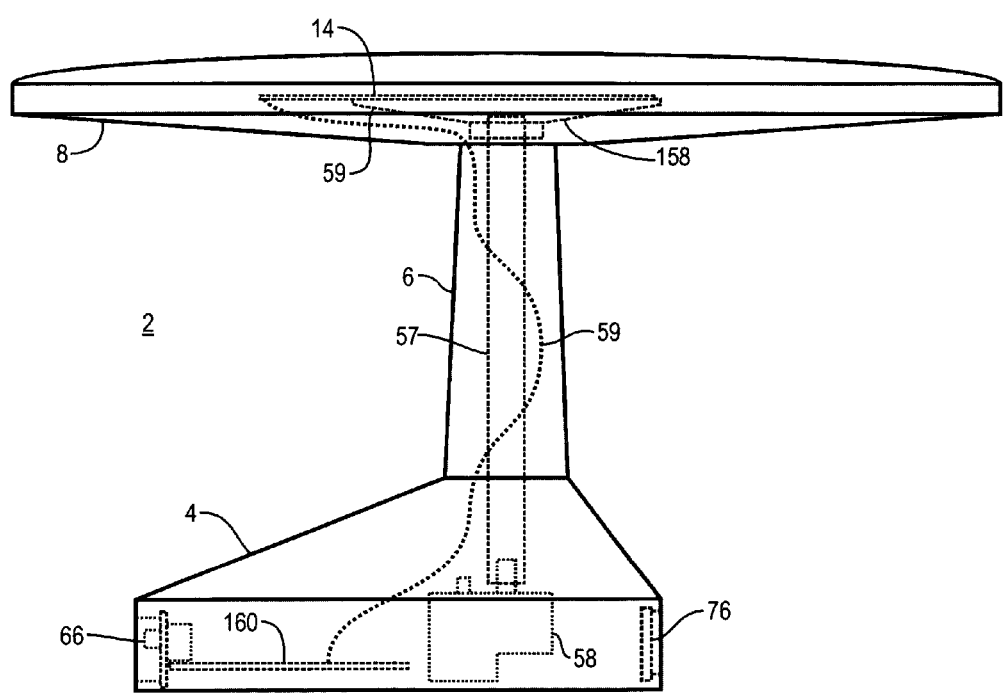
FIG. 14 is a side view of an antenna system according to an illustrative embodiment of the present invention.

Reference is directed to FIG. 14, which is a side view of the antenna system 2 according to the illustrative embodiment of the present invention. The antenna system 2 housing includes a base portion 4 and en extension portion 6 that supports a fixed raydome 8. The antenna array 14 is supported on an antenna mount 158 that engages mounting slots (not shown) on the antenna array 14. The antenna mount 158 is coupled to a rotor shaft 57 that rotatably supports the antenna mount 158 and antenna 14 within the raydome 8. A digital proportional motor 58 drives the rotor shaft 57 to rotate the antenna to the twelve aforementioned angular positions. The motor 58 is fixed within the base portion 4 of the housing. The output connector 66 is presented at the rear of the base portion 4. And is connected to a printed circuit board 160 that supports the various circuitry described elsewhere herein. A flexible coaxial feed line 59 connects the antenna to the circuitry on the printed circuit board 160. To avoid excessive twisting of the feed line 59, or alternately to avoid the requirement of a rotary electrical connection, the rotation of the antenna 14 and antenna mount 158 are constrained by a rotation stop (not shown) that limits rotation of the structure to approximately 360 degrees. The feed line 59 is routed about the rotor shaft 57 so that the feed line gracefully winds and unwinds as the structure rotates from stop to stop. The display 76 is presented at the front of the housing base 4.

Figure 15:
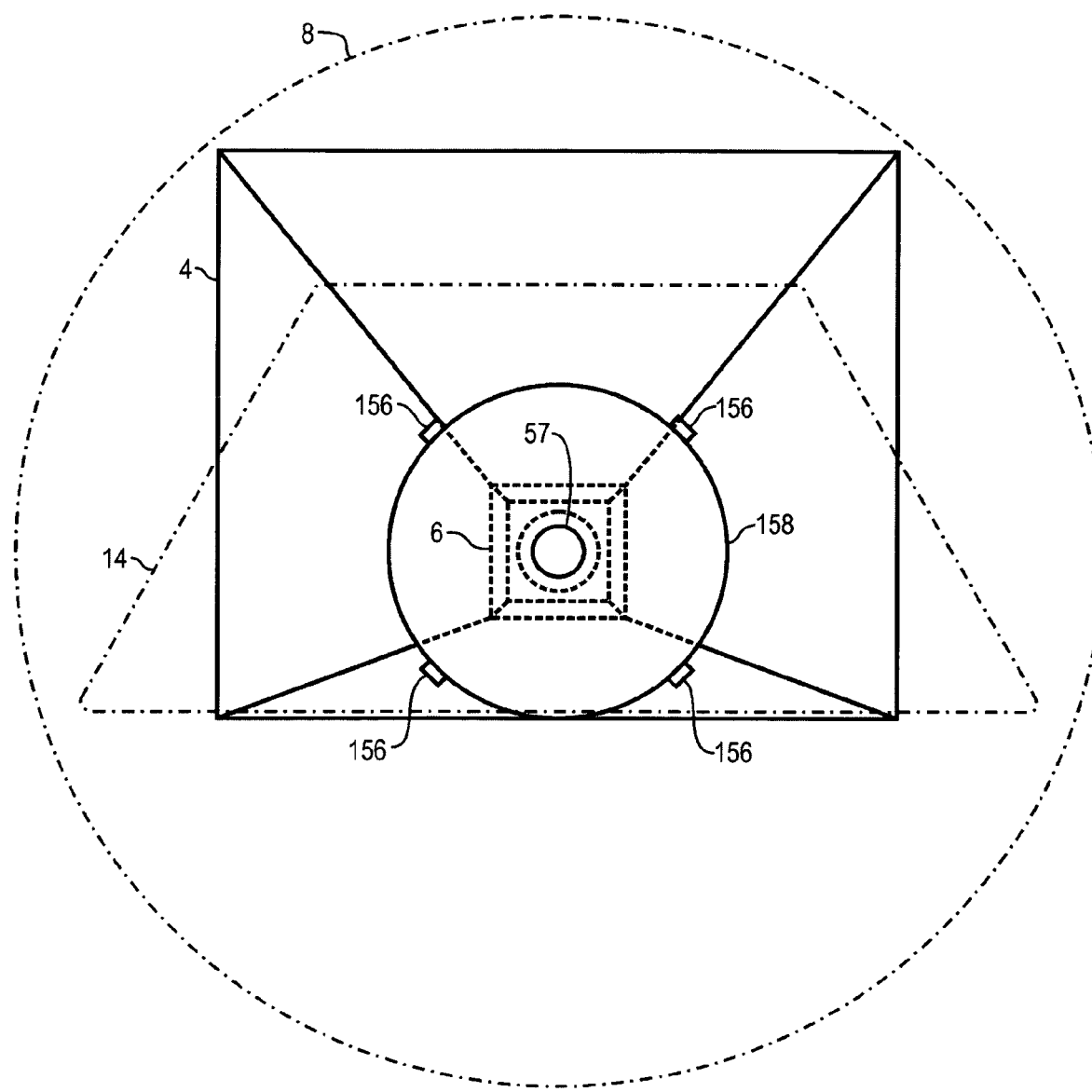
FIG. 15 is a top view of an antenna support structure according to an illustrative embodiment of the present invention.

Reference is directed to FIG. 15, which is a top view of the antenna system support structure according to the illustrative embodiment of the present invention. The antenna housing base 4 and support structure 6 are illustrated. The rotor shaft 57 is visible, and with the antenna support 158, onto which the antenna is mounted using mounting lugs 156. The position of the antenna 14 and raydome 8 are shown for reference.

Figure 16:
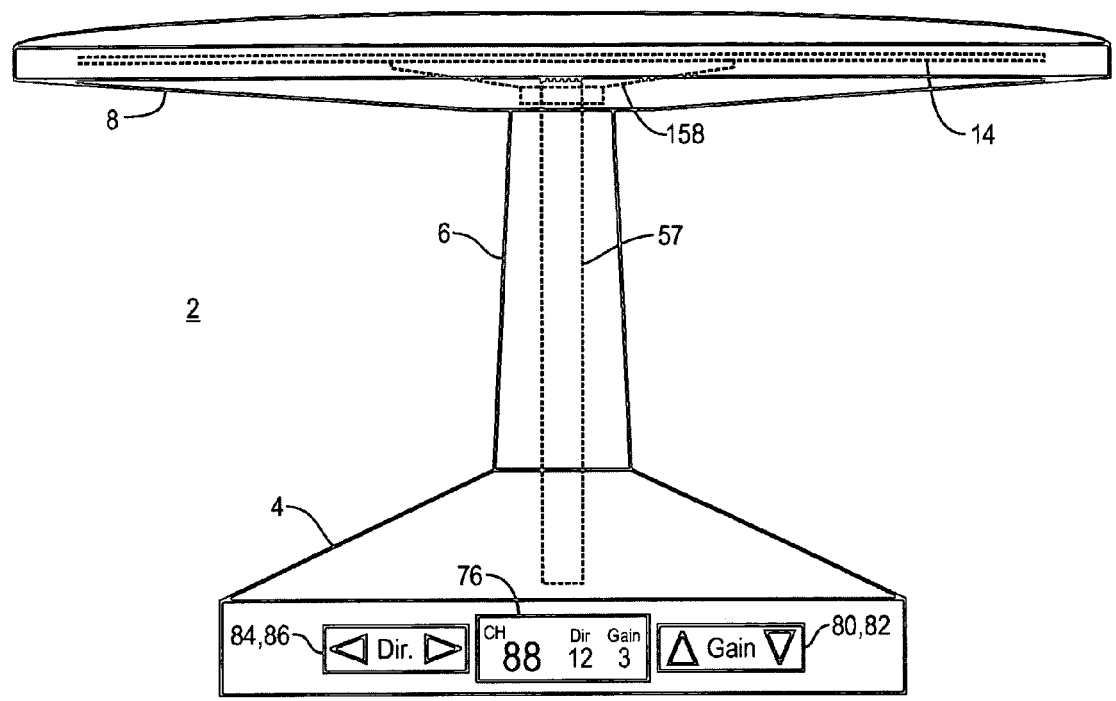
FIG. 16 is a front view of an antenna system according to an illustrative embodiment of the present invention.
Figure 17:
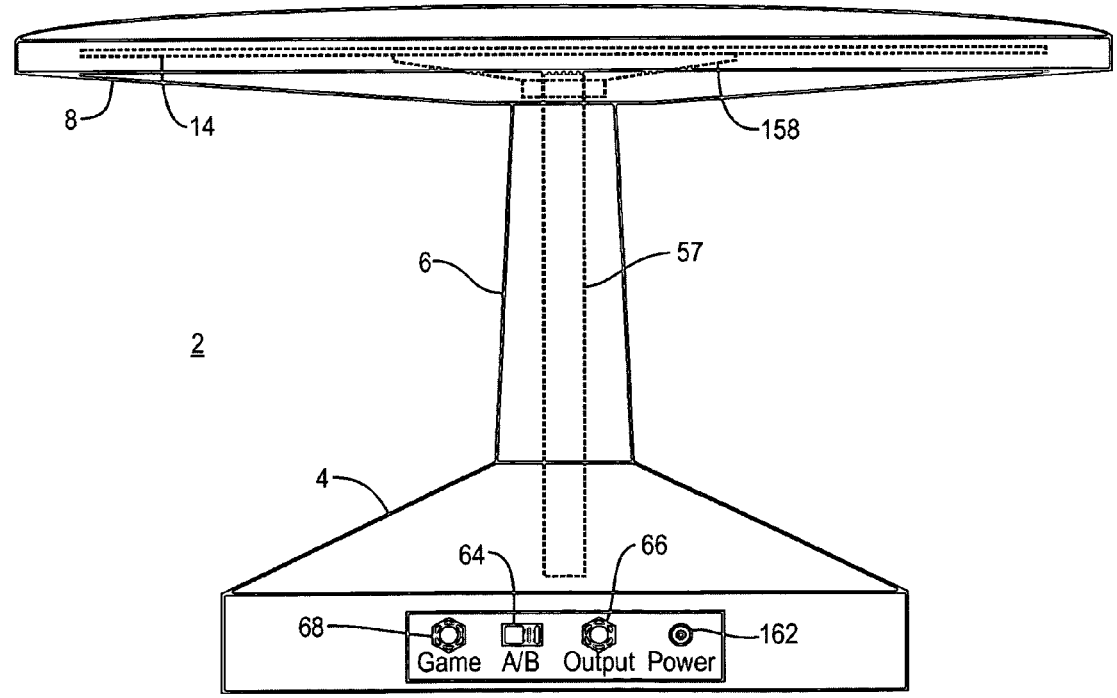
FIG. 17 is a back view of an antenna system according to an illustrative embodiment of the present invention.

Reference is directed to FIG. 16, which is a front view of the antenna system 2 according to the illustrative embodiment of the present invention. The housing base portion 4 presents the display 76, which includes a display of the present channel number, which corresponds to a memory location, as well as the present antenna rotor direction and gain setting. In the illustrative embodiment, a liquid crystal display is employed. The direction selection key actuators 84, 86 enable the user to manually change the antenna rotor direction without use of the remote controller (not shown). Similarly, the gain up and gain down key actuators 80, 82 enable the user to manual adjust the gain without use of the remote controller. The rotor shaft 57 is illustrated within the housing extension 6, which supports the fixed raydome 8. The rotor shaft 57 couples to the antenna support 158, which is connected to the antenna array 14, rotatably supported within the raydome 8. FIG. 17 illustrates the back view of the illustrative embodiment. FIG. 17 adds the interface components, which include the video game input 68, the "A/B" selector switch, the output connector 66, and the power input terminal.

Figure 18:
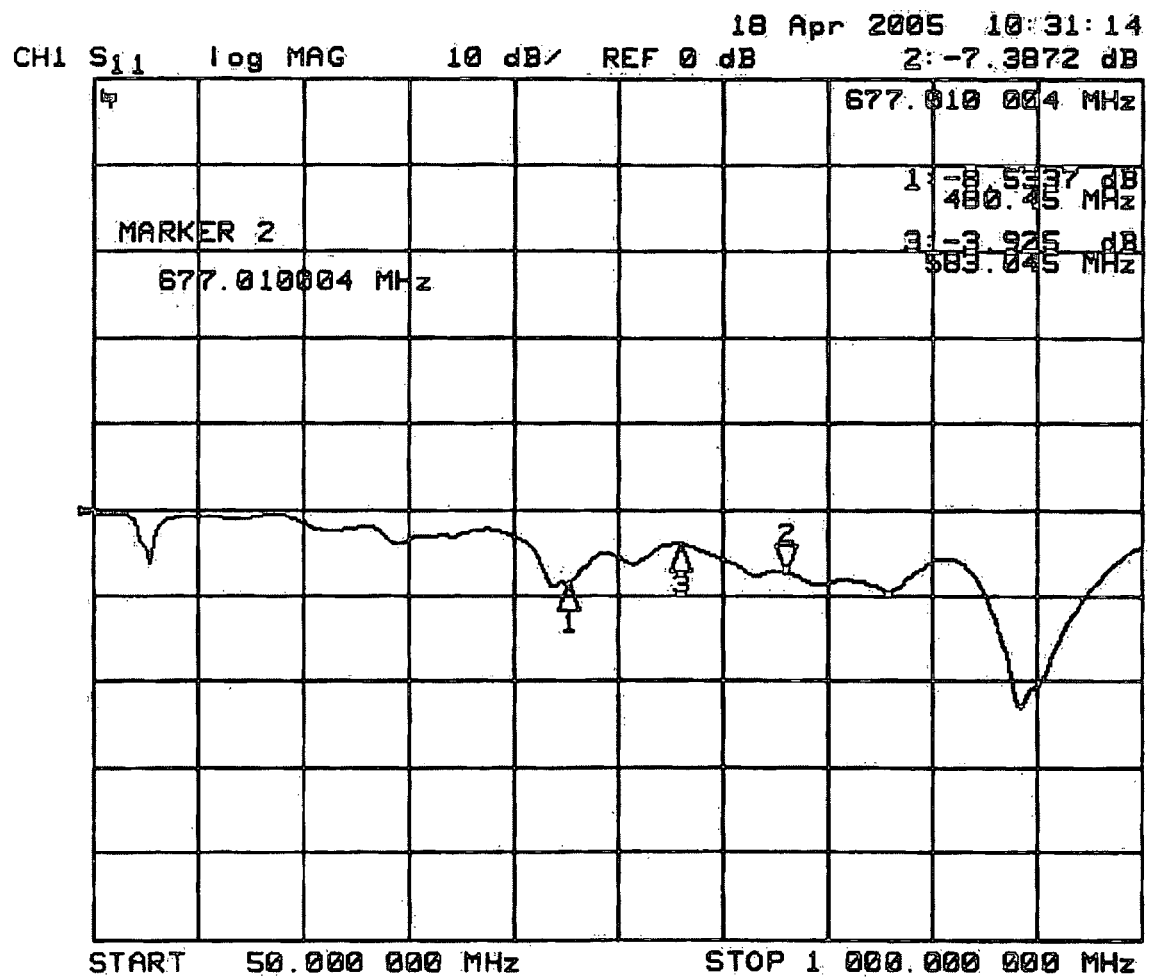
FIG. 18 is a graphical plot of the insertion loss of an antenna without a matching element according to an illustrative embodiment of the present invention.

Reference is directed to FIG. 18, which is a graphical plot of the insertion return loss in decibels of the antenna array, but without a matching element according to an illustrative embodiment of the present invention. The antenna array tested is the three element array as described herein with respect to FIGS. 7 and 9, but without the matching element. The central horizontal grid line is calibrated at zero dB, which each space representing an increment of ten dB. Thus, the line immediately below the central horizontal line is minus ten dB, the next is minus twenty dB, and so forth. The vertical lines represent frequency, the leftmost being 50 MHz, and the rightmost 1000 MHz. Each space is an increment of 95 MHz in frequency. As those skilled in the art will appreciate, the insertion return loss is worse that minus ten decibels throughout most of the band of interest, which is a marginal performance in coupling received radio signal energy.

Figure 19:
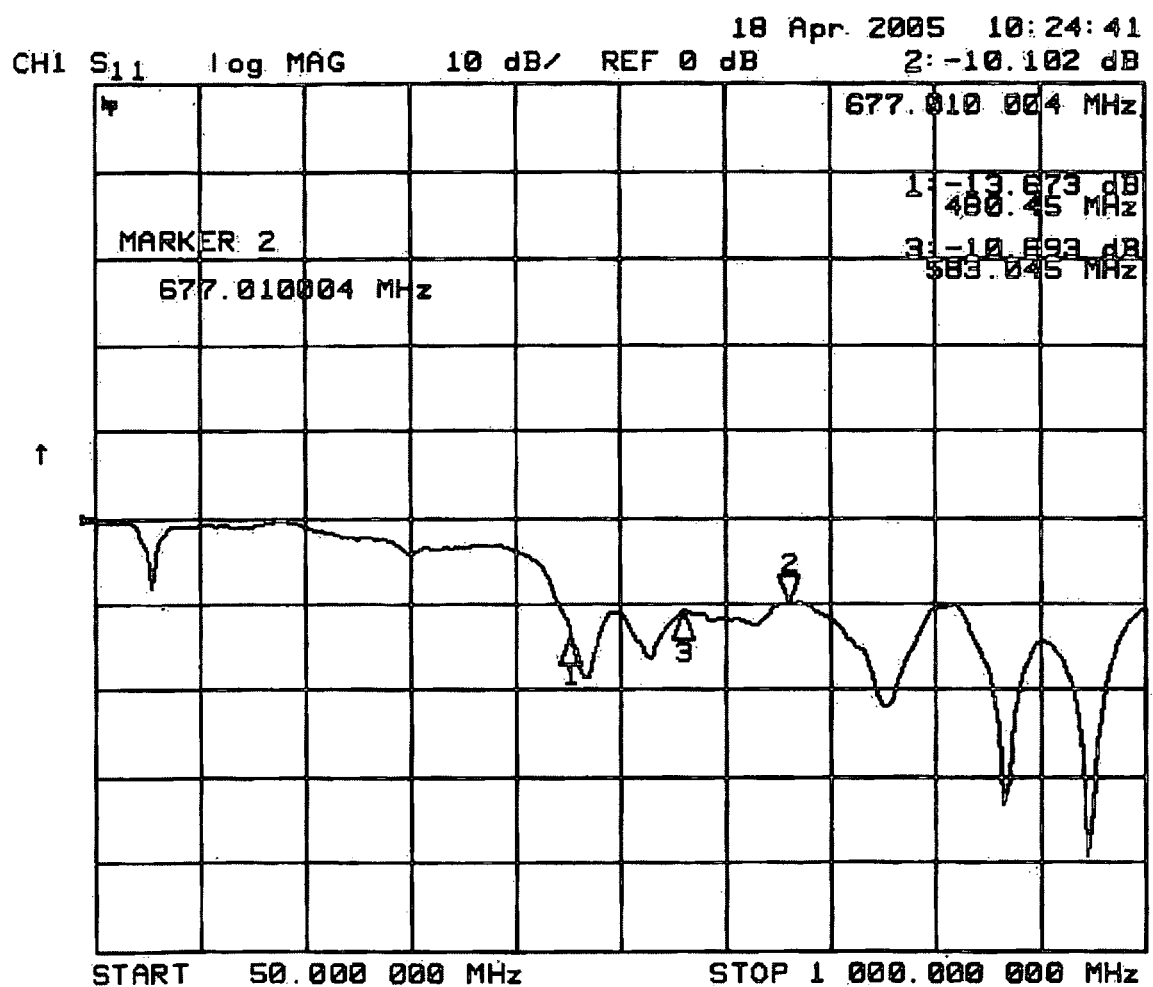
FIG. 19 is a graphical plot of the insertion loss of an antenna with a matching element according to an illustrative embodiment of the present invention.

Reference is directed to FIG. 19, which is a graphical plot of the insertion loss of the antenna, but with the matching element described with regards to FIG. 8 and according to the illustrative embodiment of the present invention. The dimensions of the graph are the same as in FIG. 18. Note that in FIG. 19, the return loss is better than minus ten decibels throughout the entire band of interest. This is true for the resonant range of 550 MHz to 890 MHz, but also for the extended band from 470 MHz to 550 MHz. This performance is achieved with the smaller array structure described hereinbefore, thereby meeting the product design requirements. Empirical test indicate passive gain form the antenna array to be as follows:

| Freq. | Gain |
| --- | --- |
| 475 MHz | +1.50 dB |
| 750 MHz | +5.70 dB |
| 900 MHz | +5.57 dB |

By way of comparison, a similar four-element log periodic array designed for the entire band of 470 MHz to 890 MHz yielded gain values as follows:

| Freq. | Gain |
| --- | --- |
| 475 MHz | +0.005 dB |
| 750 MHz | +3.240 dB |
| 900 MHz | +4.075 dB |

As will be appreciated by those skilled in the art, the illustrative embodiment three-element array with matching is more compact, has lower return loss, and more gain than the prior art designs.

Figure 20:
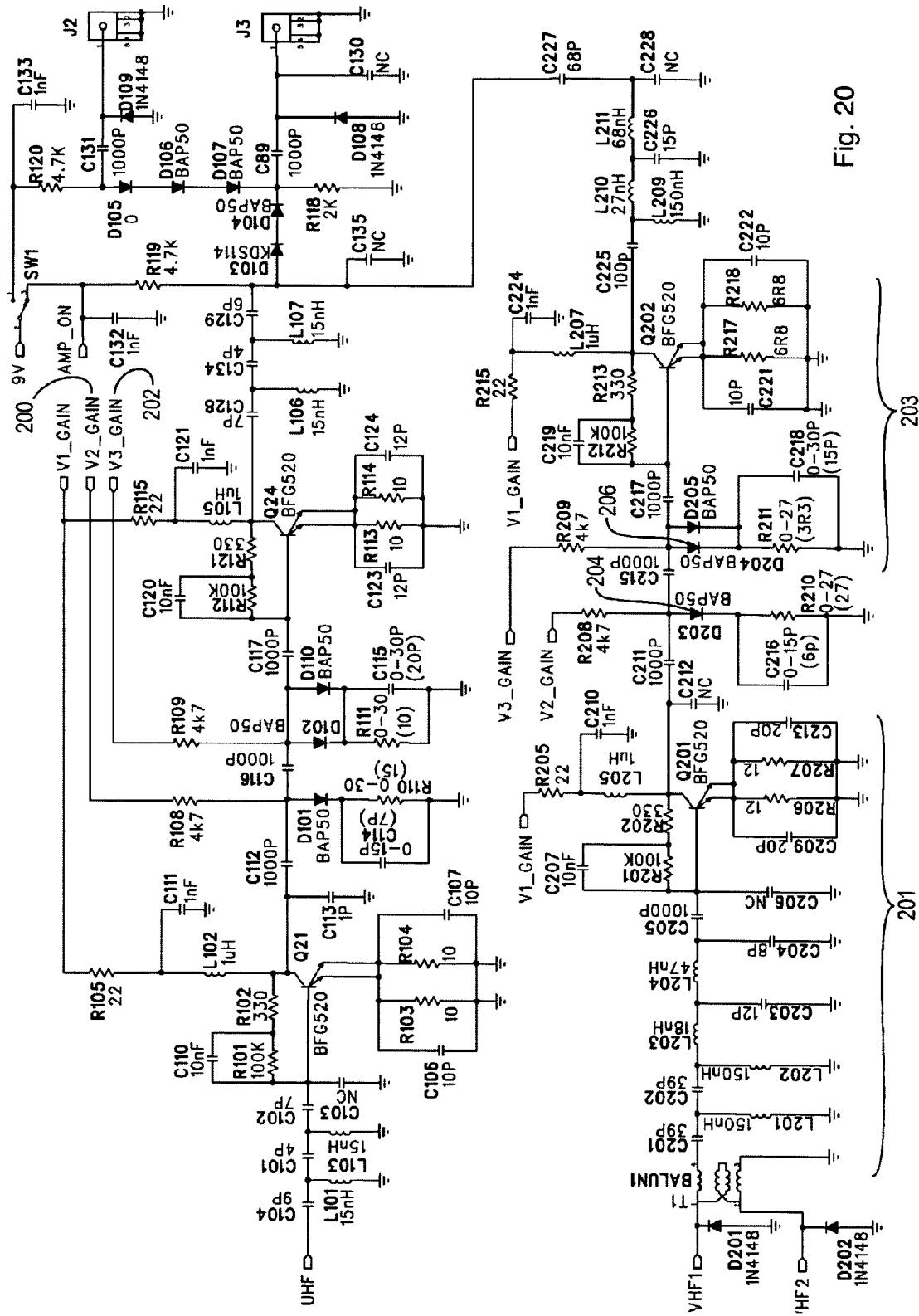
FIG. 20 is a schematic diagram of a gain controlled RF amplifier according to an illustrative embodiment of the present invention.

Reference is directed to FIG. 20, which is schematic diagram of a gain controlled two-stage RF amplifier according to an illustrative embodiment of the present invention. Those skilled in the art will appreciate the topology of the two stage RF amplifier of the illustrative embodiment. A first RF gain stage 201 is coupled to a second RF gain stage 203. Gain of the two-stage amplifier is controlled by forward biasing either or both of shunt diodes 204 and 206 located between the gain stages 201, 203, as this action varies the feedback resistance of the second RF amplifier stage 203 and therefore the signal gain. A V2 Gain input 200 is used to bias the first gain control diode 204, and a V3 Gain input 202 is used to bias the second gain control diode 206. The controller in the circuit (illustrated in FIG. 24) provides the drive to both gain control inputs 200, 202. In this fashion, the controller is able to vary the gain of the RF amplifier between +10 dB, +15 dB and +19 dB.

Reference is directed to FIG. 21, which is a schematic diagram of a RF remote control regenerative receiver according to an illustrative embodiment of the present invention. The antenna receives encoded radio signals at 433.92 MHz from the remote controller. The receiver circuitry demodulates this signal and outputs the resultant data to the controller of the illustrative embodiment.

Reference is directed to FIG. 22, which is a schematic diagram of a power supply circuit for an antenna system according to an illustrative embodiment of the present invention. The power supply circuit provides regulate power and voltage and current levels required by other circuitry within the antenna system of the illustrative embodiment. Those skilled in the art will appreciated the design topology of the circuit if FIG. 22.

Reference is directed to FIG. 23, which is a schematic diagram of an RF amplifier gain control interface circuit according to an illustrative embodiment of the present invention. The circuit of FIG. 23 couples between the controller circuit of FIG. 24 and the RF amplifier circuit of FIG. 21 using a serial interface, as will be appreciated by those skilled in the art.

Figure 24:
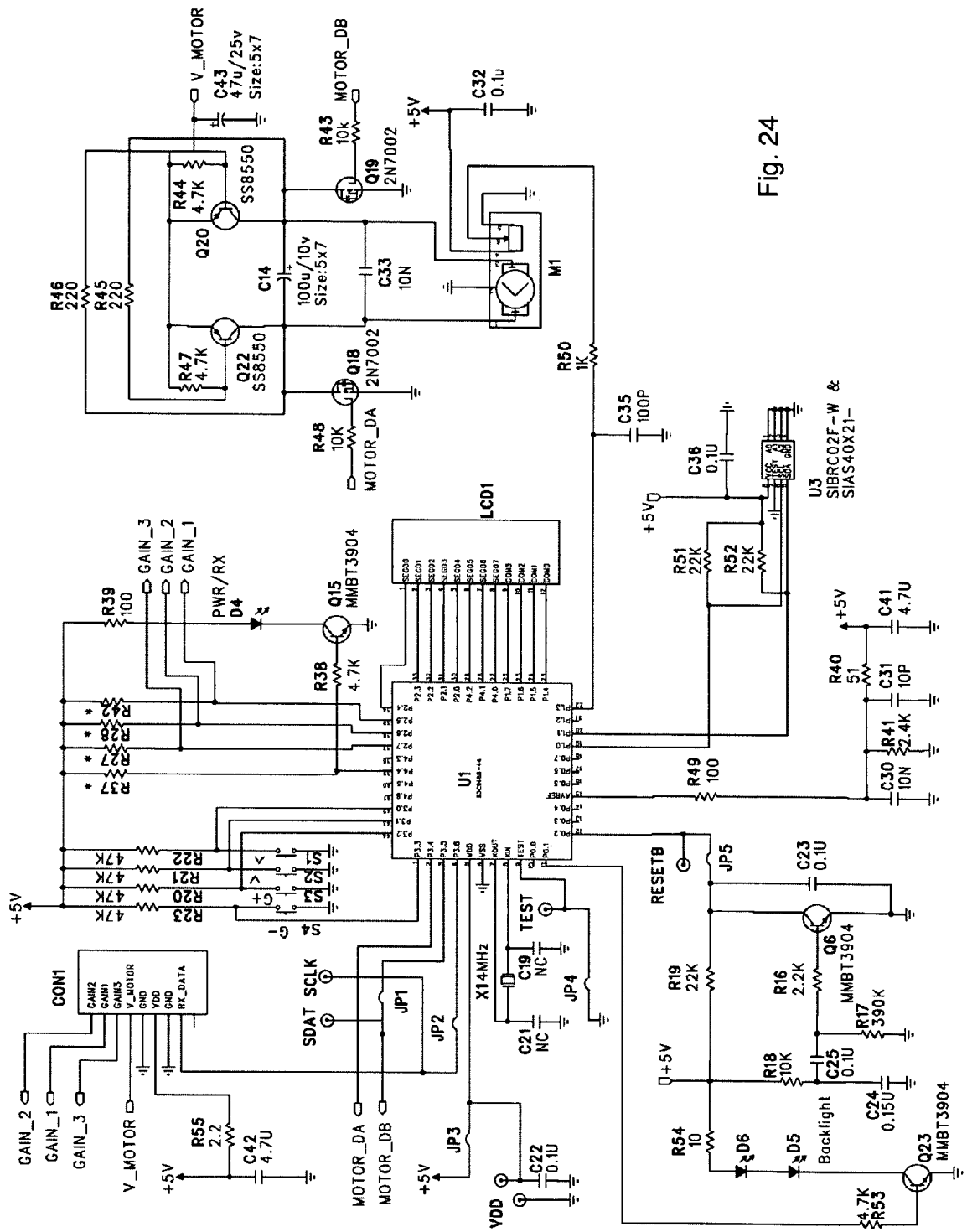
FIG. 24 is a schematic diagram of a controller with rotor motor control circuit according to an illustrative embodiment of the present invention.

Reference is directed to FIG. 24, which is a schematic diagram of a controller with rotor motor control circuit according to an illustrative embodiment of the present invention. As noted hereinbefore, the controller of the illustrative embodiment is a 4-bit microcontroller with four kilobytes of memory. The rotor motor is a digital proportional motor with position feedback, as will be appreciated by those skilled in the art upon review of the schematic diagram in FIG. 24.

Figure 25:
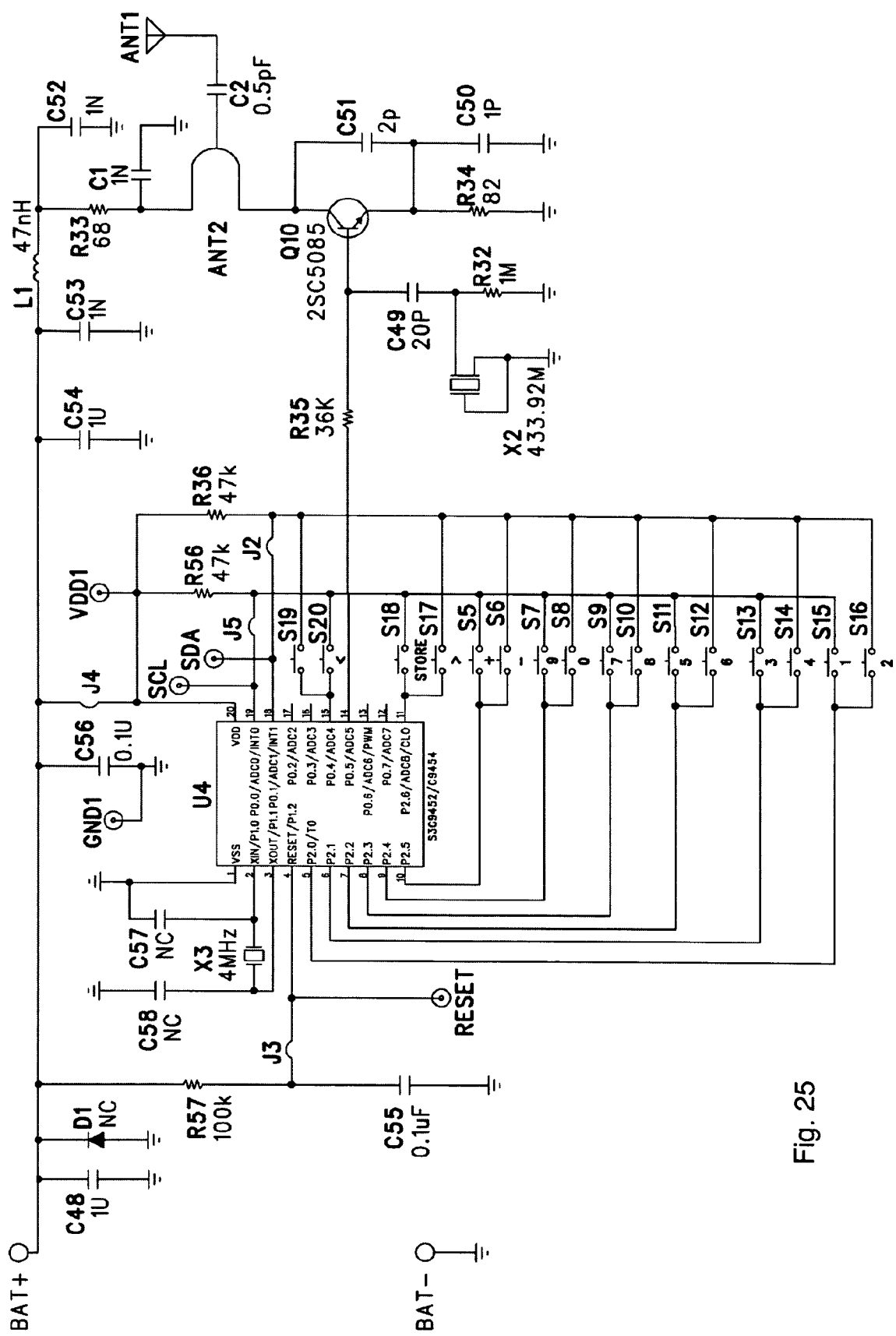
FIG. 25 is a schematic diagram of an RF remote antenna controller according to an illustrative embodiment of the present invention.

Reference is directed to FIG. 25, which is a schematic diagram of an RF remote antenna remote controller according to an illustrative embodiment of the present invention. A dedicate microcontroller is programmed to embody the aforementioned functions of the RF remote controller. A 433.92 MHz surface acoustic wave resonator provides the frequency reference, which is modulated and amplified to provide the RF signal from transmission to the illustrative embodiment antenna system.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. An antenna system for receiving radio waves and for operation in conjunction with a wireless remote controller that transmits control data including gain state data and antenna position data, comprising:
    an antenna, having passive gain and a main beam with a predetermined beam width, that receives the radio waves and outputs a radio frequency signal;
    a radio frequency amplifier coupled to receive and amplify said radio frequency signal to a gain level controlled through a gain control input;
    a housing rotatably supporting said antenna;
    a motor coupled to rotate said antenna with respect to said housing, thereby orienting the direction of said main beam, and wherein said motor is a digital proportional motor;
    a wireless remote control receiver operable to receive the control data;
    a controller coupled to said gain control input and said wireless remote control receiver, and operable to couple the gain state data from said wireless remote control receiver to said gain control input, thereby wirelessly controlling the gain level of said radio frequency amplifier, and wherein said controller is coupled to drive said motor to selectively rotate said antenna, and wherein the antenna position data defines plural discrete angular positions, and wherein
    said controller drives said motor to selectively rotate said antenna to said plural discrete positions in accordance with the antenna position data.

2. The antenna system of claim 1 wherein the wireless remote controller transmits the control data by encoded radio signals, and wherein
    said wireless remote control receiver is an encoded radio signal receiver.

3. The antenna system of claim 1 wherein said gain control input comprises plural gain control input lines electrically coupled to plural gain control diodes, and wherein said controller selectively biases said plural gain control diodes in accordance with the gain state data, thereby selectively setting said radio frequency amplifier among plural discrete gain states.

4. The antenna system of claim 3, wherein said plural discrete gain states include ten decibels, fifteen decibels, and nineteen decibels of gain.

5. The antenna system of claim 1 and wherein:
    said antenna is configured as a three-element log periodic array configured for reception of a band of frequencies from 470 megahertz to 890 megahertz.

6. The antenna system of claim 5, and wherein:
    said three-element log periodic array is disposed upon a printed circuit board substrate and designed for reception of an operating band of frequencies from 550 megahertz to 890 megahertz, thereby reducing the physical dimensions of said three-element log periodic array, and designed for an insertion return loss of less than minus ten decibels within said operating hand of frequencies, and further comprising;
    a matching element disposed upon said printed circuit board substrate and coupled to said three-element log periodic array, and tuned to match an extended band of frequencies from 470 MHz to 550 MHz with an insertion return loss of less that minus ten decibels within said extended band of frequencies.

7. The antenna system of claim 1, further comprising:
a flexible feed line for connecting said radio frequency signal between said antenna and said radio frequency amplifier, and
a rotational stop fixed to said housing and engaged to limit the rotation of said antenna to an angle of rotation of approximately three hundred and sixty degrees, thereby limiting the twist of said feed line to within said angle of rotation.

8. The antenna system of claim 1 wherein said plural discrete angular position are twelve discrete angular positions.

9. The antenna system of claim 1, further comprising:
a raydome fixed to said housing, and wherein
said antenna is disposed to rotate within said raydome.

10. The antenna system of claim 1 wherein the control data further includes location data, the system further comprising:
a memory accessed by memory addresses and coupled to said controller for storing control data, and wherein
said controller operates to store a portion of the control data at a memory address associate with the location data.

11. The antenna system of claim 10, and wherein
the location data is correlated to channel numbers that correspond to television reception channels.

12. The antenna system of claim 10 wherein the control data further includes a store command, and wherein
said controller identifies the most recently received control data as present control data, and wherein
said controller operates to store said present control data in accordance with the corresponding present location data upon receipt of the store command from said remote control receiver.

13. The antenna system of claim 12, and wherein
said controller operates to recall a portion of the control data from a memory address, and assign it as present control data, upon receipt of a new control data that includes location data but does not include gain state data or antenna position data.

14. The antenna system of claim 12, further comprising:
a display coupled to said controller, and wherein
said controller operates to display a portion of said present control data on said display.

15. The antenna system of claim 14, further comprising:
an actuator fixed to said housing for entering control data without use of the remote controller.

16. An antenna system for receiving radio waves and for operation in conjunction with a wireless remote controller that transmits encoded radio signals with control data that may include gain state data, antenna position data, location data, and a store command, the system comprising:
an antenna designed to receive the radio waves in a band of frequencies from 470 megahertz to 890 megahertz and that outputs a radio frequency signal, said antenna including a three-element log periodic array disposed upon a printed circuit board substrate that is resonant in an operating band of frequencies from 550 megahertz to 890 megahertz, thereby reducing the physical dimensions of said three-element log periodic array with respect to said band of frequencies, and designed for an insertion return loss of less than minus ten decibels within said operating band of frequencies, said antenna further including a matching element disposed upon said printed circuit board substrate and coupled to said three-element log periodic array, and tuned to match an extended band of frequencies from 470 MHz to 550 MHz with an insertion return loss of less than minus ten decibels within said extended band of frequencies;
a radio frequency amplifier coupled to receive and amplify said radio frequency signal to a gain level controlled through a gain control input that comprises plural gain control input lines electrically coupled to plural gain control diodes;
an encoded radio signal wireless remote control receiver operable to receive the control data;
a controller coupled to said plural gain control input lines and said wireless remote control receiver, wherein said controller selectively biases said plural gain control diodes in accordance with the gain state data, thereby selectively setting said radio frequency amplifier to either ten decibels, fifteen decibels, and nineteen decibels of gain, and thereby remotely controlling the gain level of said radio frequency amplifier;
a housing having a raydome rotatably supporting said antenna that is disposed to rotate within said raydome;
a digital proportional motor coupled to rotate said antenna with respect to said housing, and wherein
said controller is coupled to drive said motor to selectively rotate said antenna to twelve discrete positions in accordance with the antenna position data received in said control data;
a flexible feed line for connecting said radio frequency signal between said antenna and said radio frequency amplifier;
a rotational stop fixed to said housing and engaged to limit the rotation of said antenna to an angle of rotation of approximately three hundred and sixty degrees, thereby limiting the twist of said feed line to within said angle of rotation;
a memory accessed by memory addresses and coupled to said controller for storing control data, and wherein
said controller operates to store a portion of the control data at a memory address associate with the location data that is correlated to channel, numbers that correspond to television reception channels, and wherein
said controller identifies the most recently received control data as present control data and stores said present control data in accordance with the corresponding present location data upon receipt of the store command from said remote control receiver, and wherein
said controller operates to recall a portion of the control data from a memory address, and assign it as present control data, upon receipt of new control data that includes location data but does not include gain state data or antenna position data;
a display coupled to said controller, and wherein said controller operates to display a portion of said present control data on said display, and
an actuator fixed to said housing for entering control data without use of the remote controller.

17. A method of receiving radio waves by utilizing an antenna, having passive gain and a main beam with a predetermined beam width, that outputs a radio frequency signal to a gain controlled radio frequency amplifier, which operate in conjunction with a wireless remote controller, the method comprising the steps of:
wirelessly receiving control data including gain state data and antenna position data, which defines plural discrete angular positions, from the wireless remote controller, and
amplifying the radio frequency signal to a gain level corresponding to the gain state data, and
selectively rotating the antenna to the plural discrete positions, thereby orienting the direction of the main beam, using a digital proportional motor and in accordance with the antenna position data.

18. The method of claim 17 wherein the wireless remote controller transmits the control data by encoded radio signals, and wherein
said receiving step is accomplished with an encoded radio signal receiver.

19. The method of claim 17, further comprising the steps of:
selectively biasing plural gain control diodes in accordance with the gain control data, thereby selectively setting the radio frequency amplifier among plural discrete gain states.

20. The method of claim 17 wherein the plural discrete angular positions are twelve discrete angular positions.

21. The method of claim 17 wherein the control data further includes location data, further comprising the steps of:
storing a portion of the control data in a memory at a memory address associated with the location data.

22. The method of claim 17, and wherein
the location data is correlated to channel numbers that correspond to television reception channels.

23. The method of claim 21 wherein the control data further includes a store command, further comprising the steps of:
identifying the most recently received control data as present control data, and
storing said present control data in accordance with the corresponding present location data upon receiving a store command from the remote controller.

24. The method of claim 23, further comprising the steps of:
recalling a portion of the control data from a memory address, and assigning it as present control data upon receiving of a new control data that include location data but does not include gain state data or antenna position data.

25. The method of claim 23, further comprising the step of:
displaying a portion of said present control data on a display.

26. An antenna system for receiving radio waves and for operation in conjunction with a wireless remote controller that transmits control data including gain state data and antenna position data, comprising;
an antenna that receives the radio waves and outputs a radio frequency signal;
a radio frequency amplifier coupled to receive and amplify said radio frequency signal to a gain level controlled through a gain control input;
a housing rotatably supporting said antenna;
a motor coupled to rotate said antenna with respect to said housing;
a wireless remote control receiver operable to receive the control data;
a controller coupled to said gain control input and said wireless remote control receiver, and operable to couple the gain state data from said wireless remote control receiver to said gain control input, thereby wirelessly controlling the gain level of said radio frequency amplifier, and wherein said controller is coupled to drive said motor to selectively rotate said antenna to plural positions in accordance with the antenna position data, and wherein said antenna position data defines twelve discrete angular positions, and
said motor is a digital proportional motor, and
said controller drives said motor to selectively rotate said antenna to said twelve discrete positions in accordance with the antenna position data.

27. A method of receiving radio waves by utilizing an antenna that outputs a radio frequency signal to a gain controlled radio frequency amplifier, which operate in conjunction with a wireless remote controller, the method comprising the steps of :
wirelessly receiving control data including gain state data and antenna position data from the wireless remote controller, and
amplifying the radio frequency signal to a gain level corresponding to the gain state data, and
selectively rotating the antenna using a motor and in accordance with the antenna position data, and wherein
the antenna position data defines twelve discrete angular positions, and
said selectively rotating step includes stopping at one of twelve discrete positions in accordance with the antenna position data.

28. An antenna system for receiving radio waves and for operation in conjunction with a wireless remote controller that transmits control data including gain state data antenna position data, comprising:
an antenna that receives the radio waves and outputs a radio frequency signal;
a radio frequency amplifier coupled to receive and amplify said radio frequency signal to a gain level controlled through a gain control input;
a housing rotatably supporting said antenna;
a motor coupled to rotate said antenna with respect to said housing;
a wireless remote control receiver operable to receive the control data;
a controller coupled to said gain control input and said wireless remote control receiver, and operable to couple the gain state data from said wireless remote control receiver to said gain control input, thereby wirelessly controlling the gain level of said radio frequency amplifier, and wherein said controller is coupled to drive said motor to selectively rotate said antenna to plural positions in accordance with the antenna position data, and wherein
said antenna is a three-element log periodic array disposed upon a printed circuit board substrate and designed for reception of an operating band of frequencies from 550 megahertz to 890 megahertz, and designed for an insertion return loss of less than minus ten decibels within said operating band of frequencies, and
a matching element disposed upon said printed circuit board substrate and coupled to said three-element log periodic array, and tuned to match an extended band of frequencies from 470 MHz to 550 MHz with an insertion return loss of less that minus ten decibels within said extended band of frequencies.

* * * * *